United States Patent
Lopez et al.

(10) Patent No.: US 10,279,296 B2
(45) Date of Patent: May 7, 2019

(54) AIR FILTERING SYSTEM FOR AN ELECTRICAL ENCLOSURE

(71) Applicant: Schneider Electric Industries SAS, Rueil Malmaison (FR)

(72) Inventors: Josep Lopez, Barcelona (ES); Alain Perrin, Saint Nicolas de Macherin (FR)

(73) Assignee: SCHNEIDER ELECTRIC INDUSTRIES SAS, Rueil-Malmaison (FR)

( * ) Notice: Subject to any disclaimer, the term of this patent is extended or adjusted under 35 U.S.C. 154(b) by 116 days.

(21) Appl. No.: 15/399,300

(22) Filed: Jan. 5, 2017

(65) Prior Publication Data

US 2017/0209822 A1    Jul. 27, 2017

(30) Foreign Application Priority Data

Jan. 22, 2016    (FR) ...................................... 16 50521

(51) Int. Cl.
*B01D 46/00*    (2006.01)
*B01D 46/42*    (2006.01)
(Continued)

(52) U.S. Cl.
CPC ....... *B01D 46/0086* (2013.01); *B01D 46/002* (2013.01); *B01D 46/0005* (2013.01); (Continued)

(58) Field of Classification Search
CPC .. B01D 46/00; B01D 46/002; B01D 46/0063; F01N 3/021; F01N 3/0222; F01N 3/027; (Continued)

(56) References Cited

U.S. PATENT DOCUMENTS 4,886,532 A * 12/1989 Zimmerman ........ D01H 11/005
                                                    55/302
4,999,032 A *  3/1991 Wright ............... B01D 46/0095
                                                    55/300
(Continued)

FOREIGN PATENT DOCUMENTS

DE    28 31 167         6/1980
DE    199 49 934 A1     6/2001
(Continued)

OTHER PUBLICATIONS

French Search Report dated Sep. 20, 2016 in French Application 16 50521, filed Jan. 22, 2016 (with Translation of Categories of cited documents).

*Primary Examiner* — Duane Smith
*Assistant Examiner* — Minh Chau T Pham
(74) *Attorney, Agent, or Firm* — Oblon, McClelland, Maier & Neustadt, L.L.P.

(57) ABSTRACT

An air filtering system for an electrical enclosure including at least one filtering element arranged to filter an air flow injected into the inlet of the enclosure by a fan device, the system also including several independent filtering cells Ci, with i ranging from 1 to n and n greater than or equal to 3, each filtering cell Ci having a variable filtering capacity, each filtering cell Ci, with i greater than or equal to 2, is rendered active to filter a part of the air flow when the sum of the filtering capacities of the cells, ranging from C1 to Ci−1, drops below a specific threshold.

16 Claims, 7 Drawing Sheets

(51) Int. Cl.
*B01D 46/10* (2006.01)
*F04D 25/14* (2006.01)
*F04D 29/70* (2006.01)
*H05K 7/20* (2006.01)

(52) U.S. Cl.
CPC ..... *B01D 46/0039* (2013.01); *B01D 46/0045* (2013.01); *B01D 46/10* (2013.01); *B01D 46/4272* (2013.01); *F04D 25/14* (2013.01); *F04D 29/703* (2013.01); *H05K 7/20181* (2013.01); *B01D 2267/60* (2013.01); *B01D 2277/10* (2013.01); *B01D 2279/45* (2013.01); *F05D 2260/607* (2013.01); *F05D 2260/84* (2013.01)

(58) Field of Classification Search
CPC .......... F01N 3/032; F01N 3/0335; F01N 1/02; F01N 1/06; F01N 1/08; F01N 1/24; F01N 2330/06; F01N 2330/10; F01N 2330/60; Y10S 55/30

USPC ....... 55/385.6, 385.2, 484; 95/273; 454/184, 454/192

See application file for complete search history.

(56) References Cited

U.S. PATENT DOCUMENTS

| | | | | |
|---|---|---|---|---|
| 5,044,153 | A | * | 9/1991 | Mouton ................. F02C 7/052 415/121.2 |
| 5,672,103 | A | * | 9/1997 | Jardinier ................. F24F 11/72 454/256 |
| 2006/0021507 | A1 | * | 2/2006 | Costura ................ B01D 46/002 95/273 |
| 2009/0323281 | A1 | | 12/2009 | Herring et al. |
| 2012/0037233 | A1 | | 2/2012 | Seeliger |
| 2016/0105996 | A1 | | 4/2016 | Schanzenbach et al. |

FOREIGN PATENT DOCUMENTS

| | | |
|---|---|---|
| EP | 2 246 634 A1 | 11/2010 |
| WO | WO 2014/187903 A1 | 11/2014 |

* cited by examiner

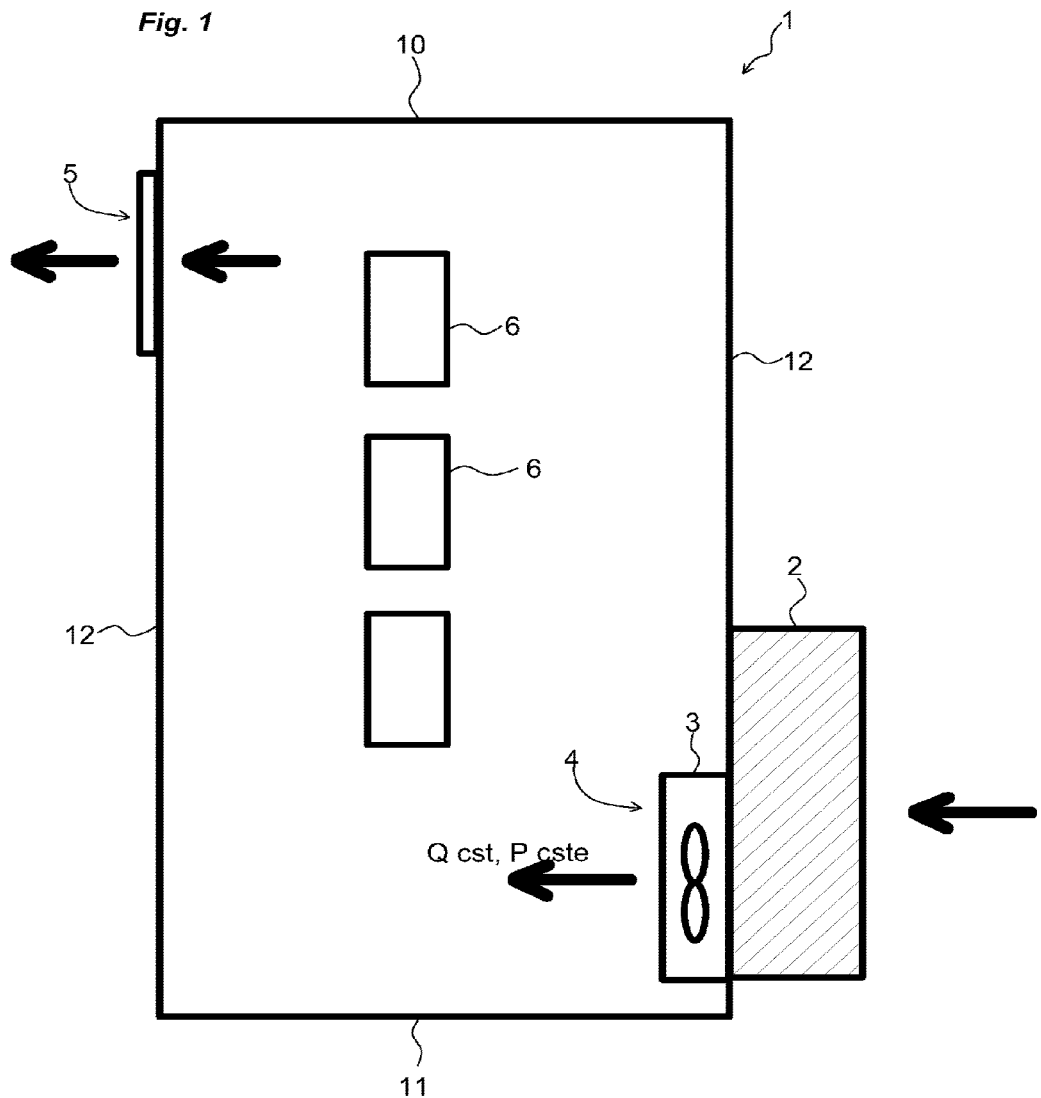

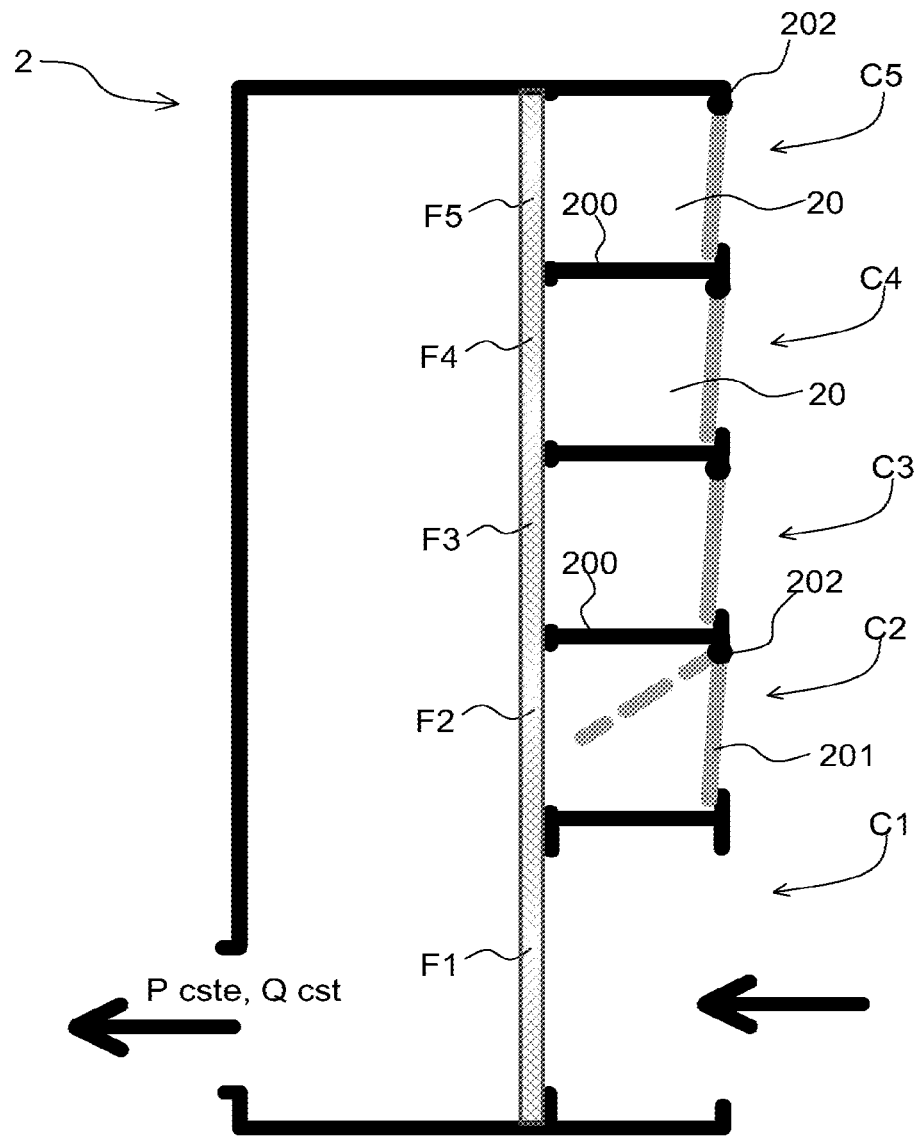

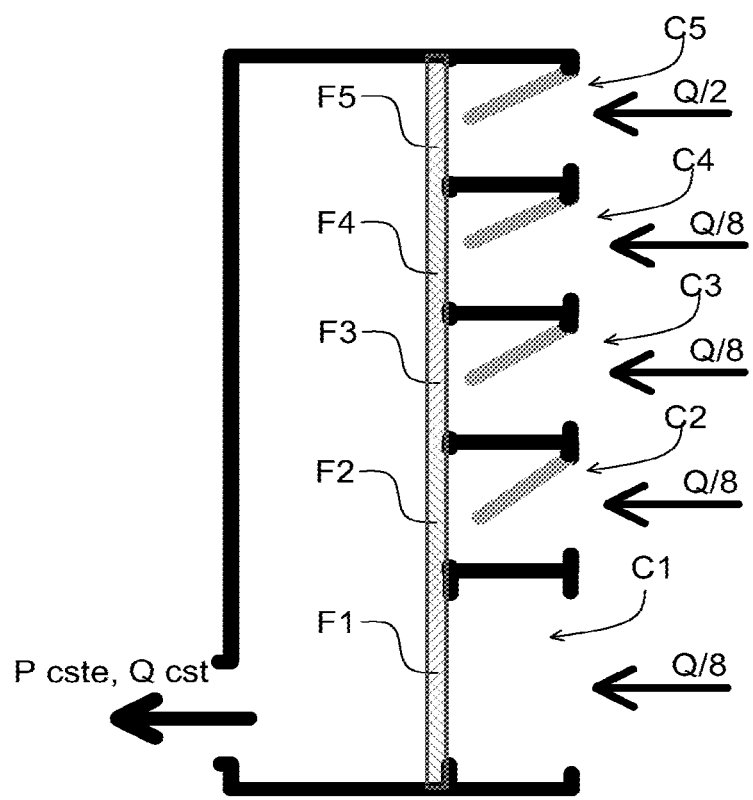

AIR FILTERING SYSTEM FOR AN ELECTRICAL ENCLOSURE

TECHNICAL FIELD OF THE INVENTION

The present invention relates to an air filtering system for an electrical enclosure.

STATE OF THE ART

For reasons of energy efficiency, it is currently necessary to take into account the electrical energy consumed to dissipate the heat of electrical devices housed in an electrical enclosure, such as an electrical cabinet for example. For this heat dissipation, the electrical enclosure generally comprises an air inlet on which a fan device is positioned in order to favour the injection of air into the enclosure to cool the electrical devices and an air outlet for discharging hot air outside the enclosure. A filter is placed on the air inlet of the enclosure to prevent the inflow of dust or other contaminating particles into the enclosure. This filter is composed of a cellular material loaded to capture particles from the outside during the inflow of air into the enclosure and thus allowing clean air to enter the electrical enclosure. To ensure efficient cooling of the electrical devices, there must always a sufficient flow of air into the enclosure.

In recent installations, an increase in the number of fans and the filtration surface area is proposed in order to improve the cooling capacity of the devices. There is thus a considerable flow of air entering the enclosure. In this type of installation, several ventilation cells, each equipped with a fan and a filter, are arranged adjacent to each other, for example.

With such a ventilation architecture, all the filters are thus used simultaneously. They can therefore wear out at the same rate or with disparities, making maintenance of the architecture more complicated. For such an architecture, various scenarios for maintaining the filtering system may be implemented, although they are never completely satisfactory. These various scenarios are as follows:
- An operator will wait until all the filters are sufficiently worn out in order to replace them all at the same time. However, this may result in a significant decrease in cooling capacity of the architecture if the filters are excessively fouled.
- An operator can replace each filter independently based on its fouling level, but this requires regular monitoring of their level of contamination.
- An operator can replace all the filters at the same time before they become too worn out. This generates greater expense and still requires regular inspections.

It should be noted that in the event of a significant decrease in cooling capacity related to excessive fouling of the filters, two distinct situations may arise:
- In a first situation, the air flow injected becomes insufficient and the electrical devices will tend to heat up, which can lead to malfunctions, their shutdown or malfunction in the event of overheating.
- In a second situation, the air flow required to properly cool down the electrical devices housed in the enclosure is maintained but puts an increased load on the fan device, which can ultimately affect its service life.

The fouling level on the air inlet filters must therefore be taken into account so that they can be cleaned or replaced in a timely manner, before either of the two situations described above occurs.

The patent application DE19949934A1 proposes to share a solution in which several filtration elements are housed in separate compartments. The compartments can be activated independently, although the proposed solution is not satisfactory as it is unable to simply adapt to the fouling level of the filtration elements.

The purpose of the invention is to propose an air filtering system for an electrical enclosure that overcomes the disadvantages of the prior art above.

DISCLOSURE OF INVENTION

This purpose is achieved by an air filtering system for an electrical enclosure, comprising at least one filtering element arranged to filter an air flow injected into the inlet of said enclosure through a fan device, said system comprising:
- several independent filtering cells $C_i$, with i ranging from 1 to n, and with n greater than or equal to 3, each filtering cell $C_i$ having a filtering capacity that is variable over time,
- each filtering cell $C_i$, with i greater than or equal to 2, being controlled active to filter a part of the air flow when the sum of the filtering capacities of the cells $C1$ to $Ci-1$ drops below a specific threshold.

According to a feature, each filtering cell $C_i$ is arranged to be mechanically activated when the inlet air flow has a pressure that exceeds a specific value, said specific value being dependent on said filtering capacity threshold of the cells $C1$ to $Ci-1$.

According to another feature, each filtering cell $C_i$ has a valve movable between an open position and a closed position, said valve being calibrated to move to its open position when the pressure of the inlet air flow becomes greater than said specific value.

According to another feature, the valve is mounted pivotally movable about an axis.

According to another feature, each cell comprises a lock arranged to lock the valve in the closed position.

According to a first alternative embodiment, in each cell, the filtering element is housed in the cell, upstream from the valve.

According to a second embodiment, in each cell, the filtering element is positioned downstream from the valve.

Advantageously, each filtering cell can include a sensor, for example, arranged to assume a first state corresponding to the deactivated state of the filtering cell or a second state corresponding to the activated state of the cell. The system includes, for example, a processing unit connected to each sensor and arranged to retrieve the status of each sensor.

Advantageously, the processing unit includes a calculation module arranged to calculate a duration between two successive activations of two filtering cells.

Advantageously, the processing unit comprises a module for predicting the replacement time of the filtering element based on the duration determined by the calculation module.

The invention also relates to an electrical enclosure intended to house electrical devices and having an air inlet, an air outlet, and a fan device arranged to favour the injection of air through the air inlet of the enclosure and a filtering system in accordance with the one defined above and positioned at the air inlet, upstream of fan device relative to the direction of air injection into the enclosure.

BRIEF DESCRIPTION OF FIGURES

Other features and advantages will become apparent from the following detailed description, with reference to the accompanying drawings in which:

FIG. 1 schematically represents a side view of an electrical enclosure on which the filtering system of the invention is positioned, FIGS. 2A and 2B schematically represents the air filtering system of the invention, shown according to two distinct alternative embodiments, FIGS. 3A to 3E illustrate the operating principle of the air filtering system of the invention, the FIG. 4 represents an advantageous alternative embodiment of the air filtering system of the invention.

DETAILED DESCRIPTION OF AT LEAST ONE EMBODIMENT

Figure 2A:
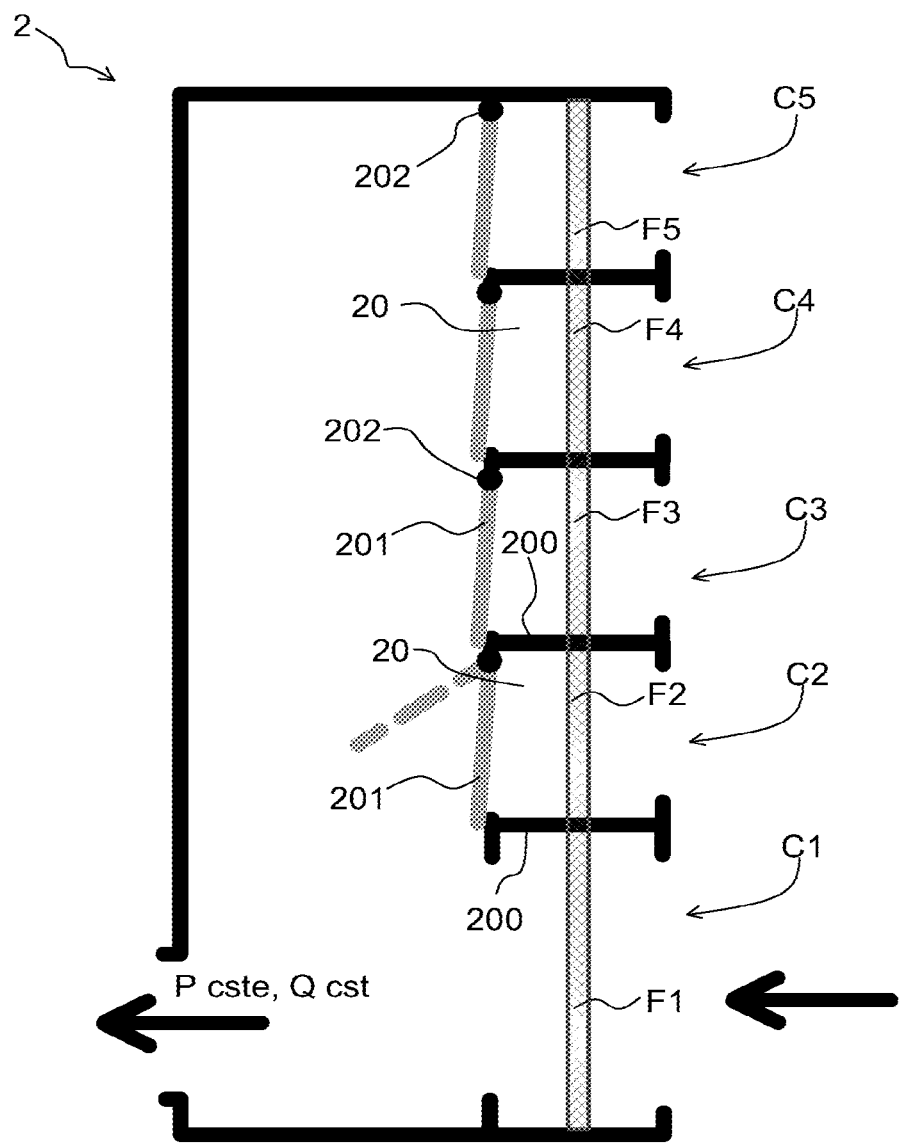
Figure 3A:
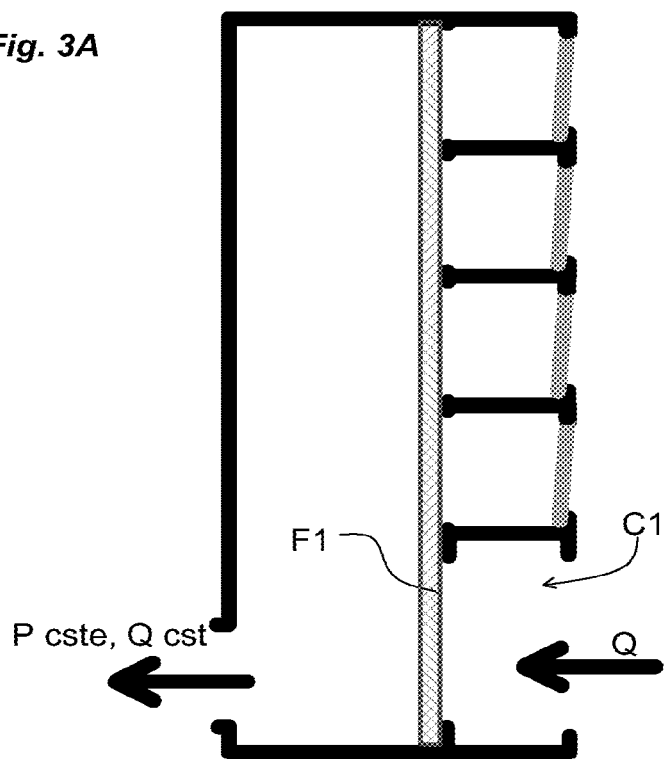
Figure 3B:
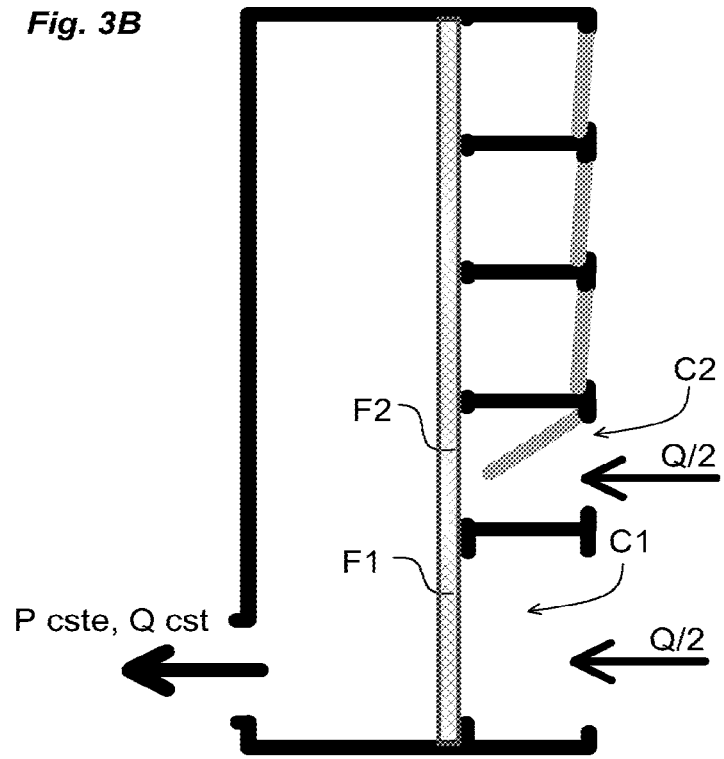
Figure 3C:
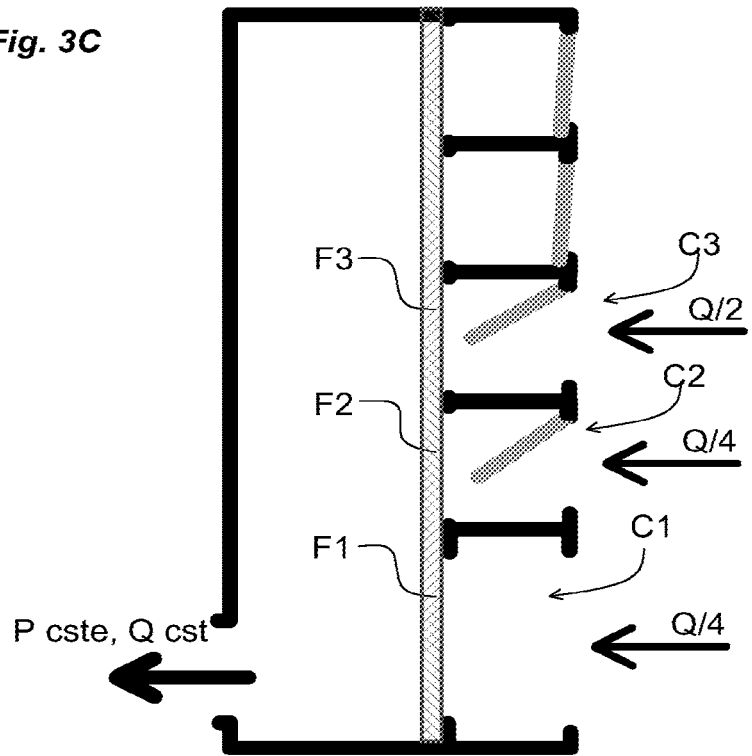
Figure 3D:
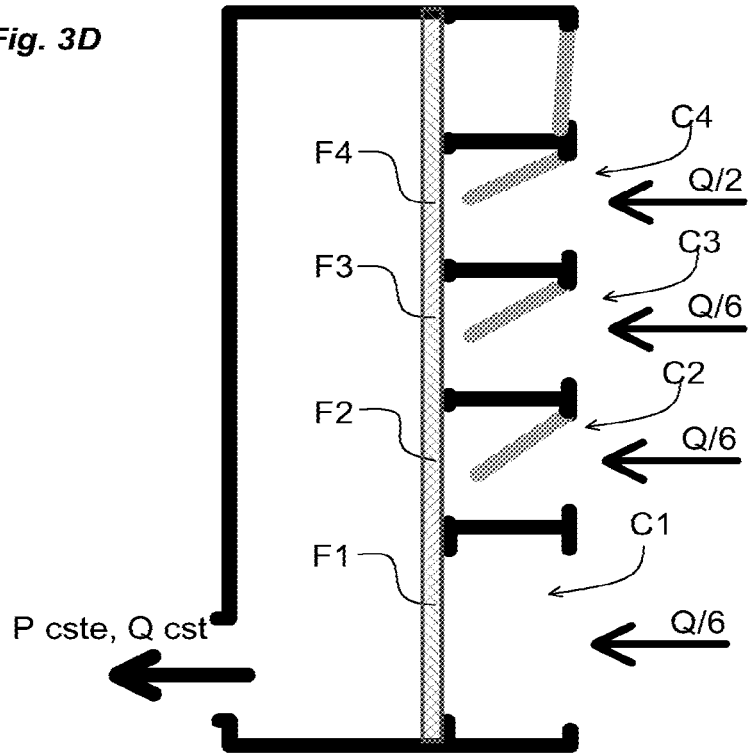

The invention relates to a filtering system 2 used to filter air injected into an electrical enclosure to cool the electrical devices installed in the enclosure.

In reference to FIG. 1, an example is taken of an electrical enclosure 1 having a parallelepiped shape comprising a top wall 10, a bottom wall 11 and four side walls 12 opposed in pairs. Of course, the filtering system of the invention can be adapted to all types, shapes and sizes of electrical enclosures.

The electrical enclosure 1 is intended to house electrical devices 6, secured on rails for example, and includes an air inlet 4 through which air is injected inside the electrical enclosure 1, and an air outlet 5 to expel hot air outside the electrical enclosure 1.

A fan device 3 is positioned on the air inlet 4 of the enclosure. When activated, it generates an air flow which is injected inside the enclosure 1.

The filtering system 2 of the invention is positioned on the air inlet 4, upstream from the fan device 3, relative to the direction of air injection into the enclosure. The filtering system is intended to filter the air flow injected via the air inlet into the enclosure thanks to the fan device 3. The outlet of the filtering system is connected to the air inlet of the enclosure 1.

For the remainder of the description and in the accompanying figures, it is assumed that the air is injected into the enclosure, thus at the outlet of the filtering system 2, at a constant flow rate Q Flow (indicated "Q cst" in the figures) and at a constant pressure P (indicated "P cste" in the figures).

In FIG. 1, the electrical enclosure equipped with the filtering system of the invention is shown in a side view and presents, in a non-limiting manner, the following arrangement:

The air inlet and the air outlet are represented on two opposite side walls 12 perpendicular to the plane of the drawing.

The filtering system 2 is secured to one side wall 12 of the enclosure, on the outside of the enclosure 1.

The fan device is positioned downstream from the filtering system 2 relative to the direction of air injection into the enclosure.

Of course, this arrangement is given only as an example and any other arrangement could be provided, notably with the air inlet and the air outlet on the other two opposite side walls or by using the top wall for the air inlet or outlet.

According to the invention, in reference to FIGS. 2A and 2B, the filtering system 2 includes several filtering cells Ci, independent and separated from one other (with i ranging from 1 to n and n preferably greater than or equal to 3). According to the size of the enclosure, the number n of cells Ci shall be, for example, adapted to adjust the cooling capacity. By the term 'independent cell', it is understood that each cell is partitioned relative to the others and is able to be traversed by an air flow distinct from that which traverses each other cell. Each cell shall include an air inlet opening outwardly toward the outside and an air outlet opening toward the air inlet of the electrical enclosure. A chamber may be arranged between the air inlet of the enclosure and the air outlets of the cells. As described below, the inlet and/or the outlet of each cell may be initially closed by a valve.

Each filtering cell Ci includes a filtering element Fi arranged to filter the air flow that passes through the cell. Each filtering element can be independent and removable or form a zone of a single larger filtering element which is shared among several filtering cells. As shown in the accompanying figures, a single filtering element may be used for all the filtering cells for example, this filtering element being shared with as many filtering zones as there are filtering cells present in the system. For the sake of simplicity, several independent filtering elements Fi will be described in the remainder of the description, each associated with one distinct filtering cell Ci.

The filtering system more specifically includes:

A primary filtering cell C1 which is initially active and through which passes the entire air flow Q created by the fan device when all other filtering cells are still inactive.

Filtering cells with incremental activation, designated C2 to Cn, which are activated incrementally as the fouling level increases in the filtering elements Fi of the already activated filtration cells.

In the accompanying figures, as an example and in a non-limiting manner, the filtering system 2 of the invention is represented with five filtering cells.

The filtering cells C2-Cn with incremental activation are activated as follows. An inactive cell Ci becomes active when the filtering capacity of the cells C1 to Ci−1 becomes insufficient, i.e. when all the filtration elements F1 to Fi−1 associated with these cells C1 to Ci−1 have an overall fouling level that exceeds a specific threshold. When this overall fouling level threshold is exceeded, at least one new filtering cell is activated in order to divide the entire air flow generated through the fan device into a greater number of cells, thereby increasing the filtration surface of the system and maintaining the filtering capacity at a sufficient level. As long as the filtering capacity of the system is sufficient through incremental activation of the filtering cells, replacement of the filtration elements may not necessarily be required. In addition, if the fan device 3 is controlled to generate a greater air flow Q, the filtering capacity of the system may be increased by activating several filtering cells simultaneously or at closer time intervals.

In reference to FIGS. 2A and 2B, a filtering cell C2-Cn with incremental activation includes a cavity 20 for example, and is separated from an adjacent filtering cell by walls 200. Each filtering cell with incremental activation includes a valve 201 which is adapted to move between a closed position and an open position. When the filtering cell is inactive, the valve 201 is in the closed position and no part of air flow passes through it. The filtering element associated with the cell can be positioned according to two possible variants:

upstream from the valve with respect to the injection direction of the air flow (FIG. 2A), or downstream from the valve with respect to the injection direction of the air flow (FIG. 2B).

The installation of the filtering element upstream from the valve notably serves to protect the latter from the pollution of the external environment.

The installation of the filtering element downstream from the valve notably serves to limit surges in air flow rates that occur when the fan device is started or during speed control variations of the fan device.

The operation and the features of the invention will be valid regardless of how the filtration elements are arranged in relation to the valves.

The valve 201 may be constructed in one single piece or in several pieces. It can move from one position to another, using different mechanisms:
- a pivoting mechanism used to rotate it about an axis 202 if it consists of a single part or about two parallel axes if it consists of two parts,
- owing to a sliding mechanism, slides being provided to allow the valve to slide.

In FIGS. 2A and 2B and in a non-limiting manner, each valve 201 is mounted pivotally movable about an axis. In these figures, the valve of the cell C2 is represented in its closed position using solid lines, and in its open position using dotted lines.

The activation of a cell, by opening the valve, may be implemented according to several distinct variants described below.

In a first variant, the valve 201 of a filtering cell Ci moves from its closed position to its open position by a simple mechanical effect. When the filtering capacity of the cells C1 to Ci−1 drops below the specific threshold, the pressure of the air to be injected into the enclosure increases, generating sufficient mechanical force to open the valve 201 of the cell Ci. The incremental activation of the cells will thus be implemented by calibrating the opening of their valves 201 in relation to the pressure of the air to be injected into the enclosure by means of the fan device. The pressure level required to open a valve 201 may be adjusted in various ways. This may occur, for example, by placing a ballast weight on the valve in an suitable manner so as to adjust the surface of the valve or to adjust the size of the cavity and/or the air inlet duct of the cell. The solution chosen may notably depend on the type of fan device used, wherein it can generate an air flow rate that is always constant or a variable air flow rate through the use of control electronics.

In a second alternative embodiment, the activation of a filtering cell Ci is controlled by a computer processing unit. When the filtering capacity of the cells C1 to Ci−1 drops below said specific threshold and is stored in the processing unit, the processing unit controls the activation of an additional filtering cell Ci. This control would be the emission of an electric signal, for example:
- to an electromechanical lock that, when activated, unlocks the valve 201, the valve being opened by natural gravity or by means of a spring or actuator type mechanical element, and/or
- to an actuator arranged to actuate the valve 201 from its closed position to its open position.

The filtering capacity of a cell may be determined in different ways:
- By measuring the fouling level of the filtering element using any known measurement system. The processing unit compares the measured fouling level with a memorized fouling threshold.
- By measuring the air flow rate at the outlet of the cell. If the air flow rate on the outlet of a cell drops below a specific threshold stored in the processing unit, this means that the filtering element no longer has a sufficient filtration capacity.
- By measuring the operating time of the filtering element and comparing with a normal duration of effective operation obtained from manufacturers data or by implementing a learning period.
- By any other measurement and/or calculation solution.

Furthermore, regardless of the alternative embodiment used to activate the cell, the valve 201 may be initially locked in its closed position to prevent accidental opening. The valve 201 may be unlocked for example by said processing unit which sends an electrical unlocking signal to an electromechanical lock when the corresponding filtering cell must be activated.

In reference to FIGS. 3A to 3E, a filtering system according to the invention and comprising a main filtering cell for example, and four filtering cells with incremental activation, operates as described below. In these figures, the operation is illustrated using the embodiment of FIG. 2B, although it must be understood that the principle is the same for the embodiment of FIG. 2A.

FIG. 3A:

Only the main filtering cell C1 is active. All the air flow Q to be injected into the enclosure by the fan device is filtered by the filtering element of the main filtering cell C1.

FIG. 3B:

The filtering capacity of the main filtering cell C1 has dropped below the specific threshold value, leading to an increase in the air pressure through the filtering system 2. When the pressure rises above the opening threshold of the valve of cell C2, the valve of this cell C2 opens. The activation threshold of the cell is, for example, set for an air flow rate equal to Q/2 through the main filtering cell C1. Once the cell C2 is active, an air flow rate equal to Q/2 passes through the main filtering cell C1 and an air flow rate equal to Q/2 passes through the filtering cell C2.

FIG. 3C:

The filtering capacity of the main filtering cell and of the previously activated filtering cell C2 becomes insufficient and drops below the specific threshold value, again resulting in an increase of the air pressure through the filtering system 2. When the air pressure rises above the opening threshold of the valve of cell C3, the valve of this cell C3 opens. As previously, the activation threshold of the cell is for example set for an air flow rate equal to Q/2 for the assembly formed by the main filtering cell C1 and the filtering cell C2. Once the cell C3 is active, an air flow rate equal to Q/4 passes through the main filtering cell C1, an air flow rate equal to Q/4 passes through the filtering cell C2, and an air flow rate equal to Q/2 passes through the filtering cell C3.

FIG. 3D:

The filtering capacity of the previously activated main filtering cell, the filtering cell C2 and the filtering cell C3 becomes insufficient and drops below the specific threshold value, again resulting in an increase in the air pressure through the filtering system 2. When the air pressure rises above the opening threshold of the valve of cell C4, the valve of this cell C4 opens. As previously, the activation threshold of the cell C4 is for example set for an air flow rate equal to Q/2 for the assembly formed by the main filtering cell, the filtering cell C2 and the filtering cell C3. Once the cell C4 is active, an air flow rate equal to Q/6 passes through the main filtering cell C1, an air flow rate equal to Q/6 passes through the filtering cell C2, an air flow rate equal to Q/6 passes through the filtering cell C3 and an air flow rate equal to Q/2 passes through the filtering cell C4.

FIG. 3E:

The filtering capacity of the previously activated main filtering cell, the filtering cell C2, the filtering cell C3 and the filtering cell C4 becomes insufficient and drops below the specific threshold value, again resulting in an increase in the air pressure through the filtering system. When the air pressure rises above the opening threshold of the valve of cell C5, the valve of this cell C5 opens. As previously, the activation threshold of the cell C5 is for example set for an air flow rate equal to Q/2 for the assembly formed by the main filtering cell, the filtering cell C2, the filtering cell C3 and the filtering cell C4. Once the cell C5 is active, an air flow rate equal to Q/8 passes through the main filtering cell, an air flow rate equal to Q/8 passes through the filtering cell C2, an air flow rate equal to Q/8 passes through the filtering cell C3, an air flow rate equal to Q/8 passes through the filtering cell C4, and an air flow rate equal to Q/2 passes through the filtering cell C5.

When the assembly formed by all the cells of the system has a filtering capacity below a specific threshold, for example corresponding to an air flow rate below Q/2, the filtration elements will need to be replaced.

Figure 4:
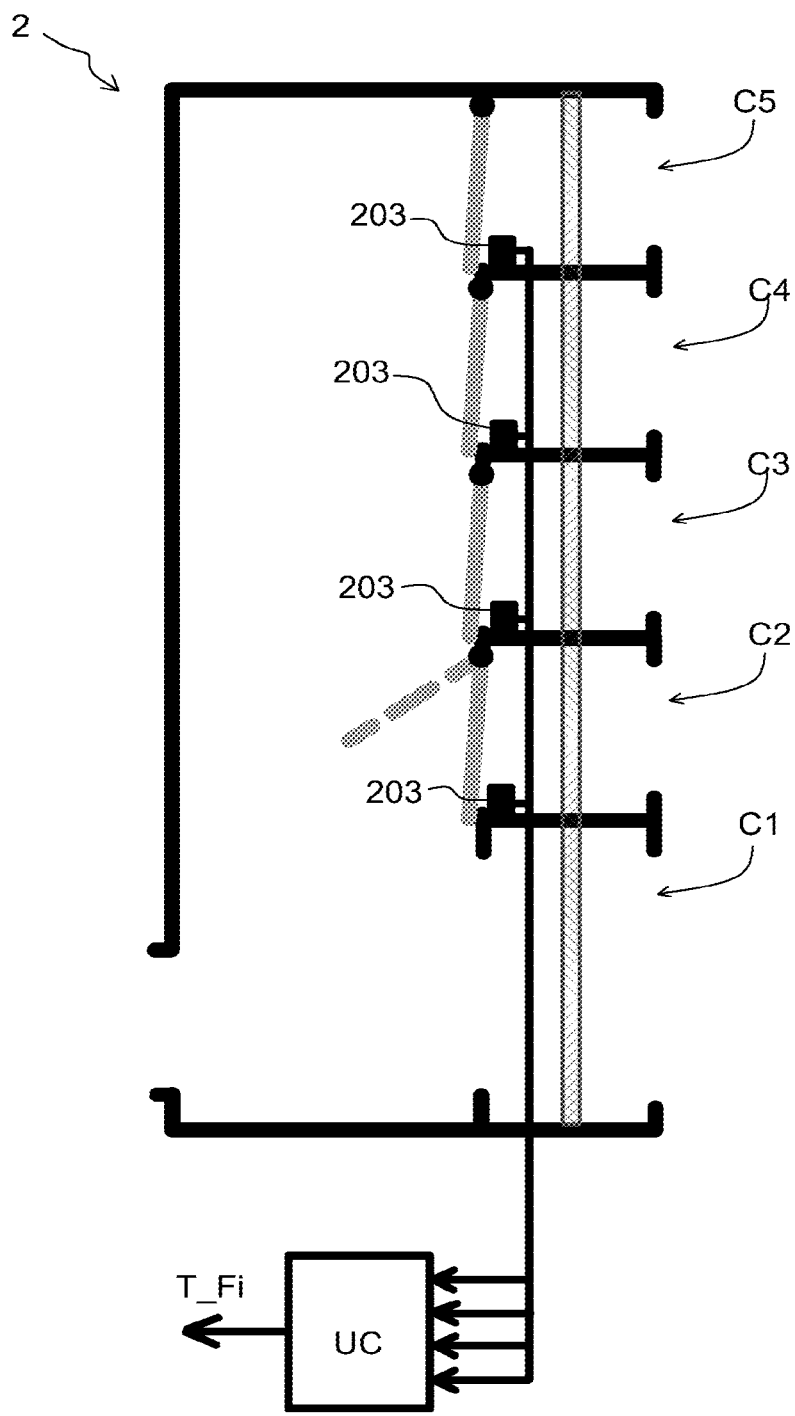

According to an alternative embodiment of the invention shown in FIG. 4, the filtering system 2 includes a sensor 203 associated with each filtering cell C2-Cn with incremental activation, to detect the moment when the cell is activated. The system 2 also includes a CPU processor with multiple inputs, each associated with a separate sensor 203 to determine the status of each sensor. The processing unit includes a calculation module arranged to determine the replacement time T_Fi of each filtering element Fi based on the time elapsed between two successive cell activations.

The invention claimed is:

1. An air filtering system for an electrical enclosure comprising:
   at least one filtering element arranged to filter an air flow injected into an inlet of said electrical enclosure by a fan device; and
   at least three independent filtering cells, including a first filtering cell and at least two additional filtering cells, each said at least two additional filtering cells having a variable filtering capacity,
   wherein the at least two additional filtering cells are configured to be individually and successively transitioned from a deactivated state to an activated state to filter a part of the air flow when a sum of filtering capacities of the first filtering cell and all of the at least two filtering cells that are active drops below a first predetermined threshold.

2. The filtering system according to claim 1, wherein each said filtering cell is configured to be mechanically activated to the activated state when the airflow injected into the inlet has a pressure that exceeds a second predetermined value, said second predetermined value being dependent on a filtering capacity threshold of the filtering cells.

3. The filtering system according to claim 1, wherein each of said at least two filtering cells has a valve movable between an open position and a closed position, said valve being calibrated to move to the open position when the pressure of the airflow injected into the inlet becomes greater than said second predetermined value.

4. The filtering system according to claim 3, wherein the valve is mounted pivotally movable about an axis.

5. The filtering system according to claim 3, wherein each of said at least two filtering cells includes a lock configured to lock the valve in the closed position.

6. The filtering system according to claim 3, wherein in each of the filtering cells the filtering element is housed in the filtering cell, upstream from the valve.

7. The filtering system according to claim 3, wherein in each of the filtering cells the filtering element is positioned downstream from the valve.

8. The filtering system according to claim 1, wherein each said filtering cell includes a sensor configured to assume a first state corresponding to the deactivated state of the filtering cell or a second state corresponding to the activated state of the filtering cell.

9. The filtering system according to claim 8, further comprising a processor connected to each said sensor and configured to retrieve a status of each said sensor.

10. The filtering system according to claim 9, wherein the processor includes a calculation module configured to calculate a duration between two successive activations of two filtering cells of the at least three filtering cells.

11. The filtering system according to claim 10, wherein the processor includes a module configured to predict a replacement time of the at least one filtering element based on the duration determined by the calculation module.

12. An electrical enclosure intended to house electrical devices and having an air inlet, an air outlet, and a fan device configured to inject air through the air inlet of the electrical enclosure, comprising the air filtering system according to claim 1 and positioned at the air inlet, upstream from the fan device relative to a direction of air injection into the electrical enclosure.

13. The filtering system according to claim 1,
   wherein each of said at least two filtering cells has a valve movable between an open position and a closed position, said valve being calibrated to move to the open position when the pressure of the airflow injected into the inlet becomes greater than said second predetermined value, and
   wherein said first filtering cells is free of any valves.

14. The filtering system according to claim 1, wherein the at least two additional filtering cells are configured to be individually deactivated when the sum of the filtering capacities of the first filtering cell and all of the at least two filtering cells that are active is above the first predetermined threshold.

15. The filtering system according to claim 1, wherein the at least two additional filtering cells are configured to remain activated so long as the sum of the filtering capacities of the first filtering cell and all of the at least two filtering cells that are active is above the first predetermined threshold.

16. The filtering system according to claim 1, wherein the first filtering cell is configured to remain active at all times.

* * * * *